United States Patent [19]

Shannon

[11] Patent Number: 4,566,020

[45] Date of Patent: Jan. 21, 1986

[54] HOT-ELECTRON AND HOT-HOLE TRANSISTORS HAVING SILICIDE CONTACTS

[75] Inventor: John M. Shannon, Whyteleafe, England

[73] Assignee: U.S. Philips Corporation, New York, N.Y.

[21] Appl. No.: 481,517

[22] Filed: Apr. 1, 1983

[30] Foreign Application Priority Data

Apr. 8, 1982 [GB] United Kingdom ............... 8210534

[51] Int. Cl.[4] ............... H01L 29/48; H01L 27/02; H01L 23/48; H01L 29/72
[52] U.S. Cl. ............... 357/15; 357/13; 357/20; 357/34; 357/47; 357/65; 357/67; 357/71; 357/86
[58] Field of Search ............... 357/15, 34, 47, 67 S, 357/71 S, 86, 13, 20, 65, 91

[56] References Cited

U.S. PATENT DOCUMENTS

| 4,410,902 | 10/1983 | Malik | 357/13 |
| 4,446,476 | 5/1984 | Isaac et al. | 357/71 S |
| 4,492,971 | 1/1985 | Bean et al. | 357/15 |

FOREIGN PATENT DOCUMENTS 2056166  3/1981  United Kingdom ............... 357/34

OTHER PUBLICATIONS

R. J. Malik et al, "GaAa Planar Doped Barriers by Molecular Beam Epitaxy", *International Electron Devices Meeting, Technical Digest,* 1980, pp. 456–459.

Primary Examiner—James J. Carroll
Attorney, Agent, or Firm—Robert T. Mayer; Steven R. Biren

[57] ABSTRACT

A unipolar hot-electron or hot-hole transistor has its base region and/or collection region electrically contacted and extended to the semiconductor body surface by a metal-silicide region which extends through a silicon surface region belonging to either the transistor emitter or the emitter-base barrier. The metal-silicide region forms an isolating Schottky barrier with an adjacent semiconductor portion. Preferably, the surface region is divided into separate first and second portions by the base-contacting metal-silicide region, with the emitter-base barrier and base-collector barrier terminating at one or more sides in this metal-silicide region. The isolating Schottky barriers are good quality unipolar diodes, thus avoiding minority charge carrier storage effects in these unipolar transistors, while the metal-silicide region can form good ohmic contacts to highly-conductive base and collector regions which typically comprise a high-doped semiconductor layer or a metal-silicide layer.

18 Claims, 5 Drawing Figures

4,566,020

HOT-ELECTRON AND HOT-HOLE TRANSISTORS HAVING SILICIDE CONTACTS

BACKGROUND OF THE INVENTION

This invention relates to transistors, both hot-electron transistors and hot-hole transistors, particularly but not exclusively for high frequency applications, fast switching applications, or opto-electronic applications. Such a transistor may be in the form of a discrete device, or it may be integrated in a more complex structure, for example in a monolithic integrated circuit.

Published U.K. patent application serial no. (GB-A) 2056166 discloses both hot-hole transistors and hot-electron transistors comprising a semiconductor body including a silicon surface region adjacent a surface of the body, a base region which at least partially underlies the surface region, a collector region which at least partially underlies the base region, and barrier-forming means which form an emitter-base barrier between the base region and at least a portion of the surface region and a base-collector barrier between the base region and the collector region, the current flow through the base region from across the emitter-base barrier being by hot charge carriers characteristic of one conductivity type. Such transistors are majority-carrier (unipolar) devices and so can be operated at a fast speed or high frequency. The surface region may be of the one conductivity type and form part of the transistor emitter, or it may be a low-doped region of opposite conductivity type and form part of the emitter-base barrier.

In one form of transistor disclosed in GB-A 2056166, areas of the semiconductor body (which is of gallium arsenide) are etched away to remove corresponding areas of various regions of the transistor over the whole of their thickness so as to terminate laterally the emitter-base and base-collector barriers in an isolated manner at the semiconductor surface and to expose the individual regions of the transistor for contacting at the surface by respective electrode layers. However such etching results in an unpassivated non-planar mesa-shaped semiconductor surface, whereas a passivated substantially planar surface is generally more desirable, particularly for integrated circuits.

Most of the transistors disclosed in GB 2056166, as well as in the related U.S. Pat. No. 4,149,174 to which reference is made in GB 2056166, have lateral portions of the individual semiconductor regions of the transistor which extend to the upper body surface in a laterally surrounding manner. Sometimes a highly-doped extra surface-adjacent region is provided to form these lateral portions. The upper surface of the semiconductor body (which is of silicon) is substantially planar and is passivated with an insulating layer. Thus it is known in these transistors to terminate the base-collector barrier and the emitter-base barrier in an undepleted laterally-surrounding annular region of opposite-conductivity type to that of the hot charge-carrier flow in the base region. This undepleted opposite-conductivity type region also provides p-n junctions, which serve for isolating from each other the collector, base and emitter-surface regions adjacent the upper surface where electrode connections are made to the individual regions of the transistor. It has been found that such p-n junction isolation can lead to slight minority charge carrier storage effects in these majority carrier devices, as well as being wasteful of space at the surface of the semiconductor body.

SUMMARY OF THE INVENTION

According to the present invention there is provided a transistor comprising a semiconductor body including a silicon surface region adjacent a surface of the body, a base region which at least partialy underlies the surface region, a collector region which at least partially underlies the base region, and barrier-forming means which form an emitter-base barrier between the base region and at least a portion of the surface region and a base-collector barrier between the base region and the collector region, the current flow through the base region from across the emitter-base barrier being by hot charge carriers characteristic of one conductivity type, is characterised in that at least one of the base and collector regions is extended to said surface of the body by a metal-silicide region which extends from said surface at least through the thickness of the surface region to contact electrically said one of the base and collector regions, said metal-silicide region forming an isolating Schottky barrier with an adjacent semiconductor portion of the body to isolate electrically said one of the base and collector regions from said adjacent semiconductor portion.

This invention is based on the recognition that such isolation (as well as electrode contacting) of transistor regions in a hot-electron or hot-hole transistor by metal-silicide regions can be readily effected because in practice the thickness of silicon which can be consumed by silicide formation in a silicon body portion is comparable with the shallow depths desirable for emitter, base and collector regions of these transistors and that furthermore the isolating Schottky barriers so formed are good quality unipolar diodes, thus avoiding minority charge carrier storage effects while the metal-silicide regions can nevertheless form good ohmic contacts to base and collector regions which typically comprise highly-doped semiconductor layers or silicide layers. Furthermore, such metal-silicide connection regions have a lower resistivity than a highly-doped semiconductor region and can be fabricated at low temperatures or by transient heating techniques so as not to adversely effect the doping profile of previously-doped regions of the body, such as for example previously-formed barrier regions.

The adjacent semiconductor portion with which one said metal-silicide region forms an isolating Schottky barrier may be a portion of said surface region, or a portion underlying the base region and belonging to either the collector region or the base-collector barrier, or, for example, a substrate portion underlying the collector region. It is frequently desirable to form such an isolating Schottky barrier with a portion of said surface region in order to isolate the collector from the base or emitter of the transistor.

A particularly well-isolated base structure is obtained in accordance with the invention when one said metal-silicide region which extends the base region to the surface of the body divides the surface region into separate first and second portions, the first portion being present between the base region and an emitter connection, the second portion being located adjacent a collector connection, this dividing metal-silicide region being isolated from one of the first and second portions by the isolating Schottky junction during operation of the transistor. The first portion of the surface region is preferably an emitter portion of the one conductivity type, but it may be instead an opposite-conductivity type portion (or even an intrinsic portion) of the emitter-base barrier. The second portion of the surface region may be electrically united with the collector region. Such a dividing metal-silicide region contacting the base region preferably laterally surrounds the whole of said first portion of the surface region. At least the emitter-base barrier preferably terminates at least at one side in said dividing metal-silicide region.

Such metal-silicide regions provided in accordance with the invention may connect the base region to a base electrode layer present at the surface of the body. However such a metal-silicide region contacting the base region may be provided in accordance with the invention for isolation purposes even when the transistor has no base electrode layer, for example in a phototransistor in accordance with the invention.

The base region may comprise at least a highly-doped semiconductor portion of the one conductivity type which is at least $10^3$ times more highly doped than the portion of the surface region with which the metal-silicide region forms the isolating Schottky barrier. Thus, the base region may be a single highly-doped semiconductor region having a conductivity type determining doping concentration of at least $10^{20}$ dopant atoms/cm$^3$, and the emitter-base and base-collector barriers can be formed by semiconductor barrier regions as described in GB-A 2056166. However, other types of base regions and barrier regions are possible. Thus, for example, the base region may itself be a metal-silicide layer which forms an emitter-base Schottky barrier with an emitter-region semiconductor portion of the one conductivity type and a base-collector Schottky barrier with a collector-region semiconductor portion also of the one conductivity type.

A metal-silicide region provided in accordance with the invention may connect the collector region to a collector electrode layer at the same surface of the body as an emitter electrode of the transistor. The collector region preferably has a highly conductive portion (either a highly-doped semiconductor layer of the one conductivity type or a silicide layer) which is contacted by the metal-silicide connection region and which is separated from the base-collector barrier by a lower-conductive low-doped semiconductor portion of the collector region in order to maintain the blocking characteristics of the base-collector barrier. This low-doped portion of the collector region may extend to a portion of the surface region at an area between the base region and the metal-silicide region of the collector connection; in this case this portion of the surface region may be separated from a portion associated wth the transistor emitter by a dividing metal-silicide region extending the base region in the manner described hereinbefore, or by p-n junction were the surface region is of opposite conductivity type.

BRIEF DESCRIPTION OF THE DRAWING

Embodiments of the invention illustrating, by way of example, these and other particular features in accordance with the invention will now be described with reference to the accompanying diagrammatic drawings in which.

Figure 1:
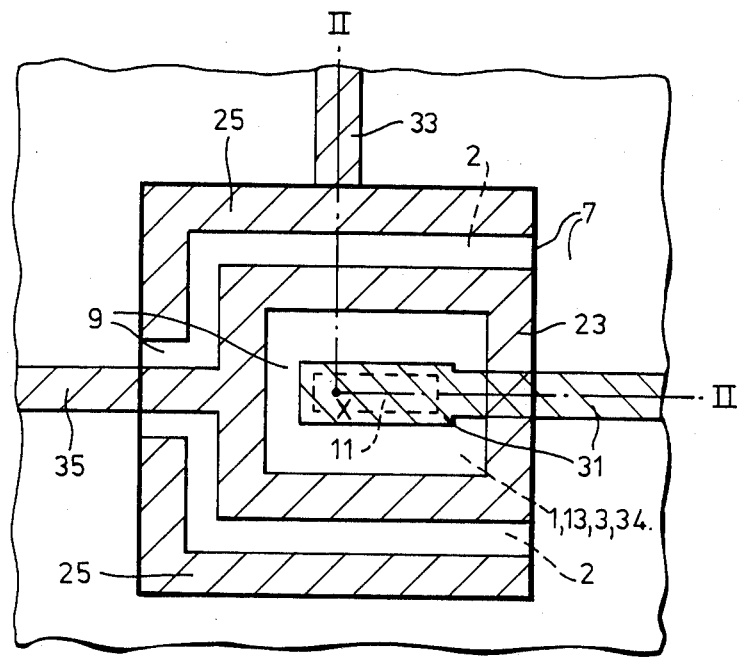
FIG. 1 is a plan view of a hot-electron transistor in accordance with the invention.

It should be noted that all of the Figures are diagrammatic and not drawn to scale. The relative dimensions and proportions of various parts of these Figures have been shown exaggerated or reduced for the sake of clarity and convenience in the drawing, especially the thicknesses of some parts in the cross-sectional views of FIGS. 2, 4 and 5. The same reference numerals as used in one embodiment are generally used to refer to corresponding or similar parts in the other embodiments. Furthermore it should be noted that for clarity in the drawing, the semiconductor regions are not hatched in the cross-sectional views of FIGS. 2, 4 and 5, while the metal and metal-silicide regions are also hatched in the plan views of FIGS. 1 and 3.

DESCRIPTION OF THE PREFERRED EMBODIMENTS

Figure 2:
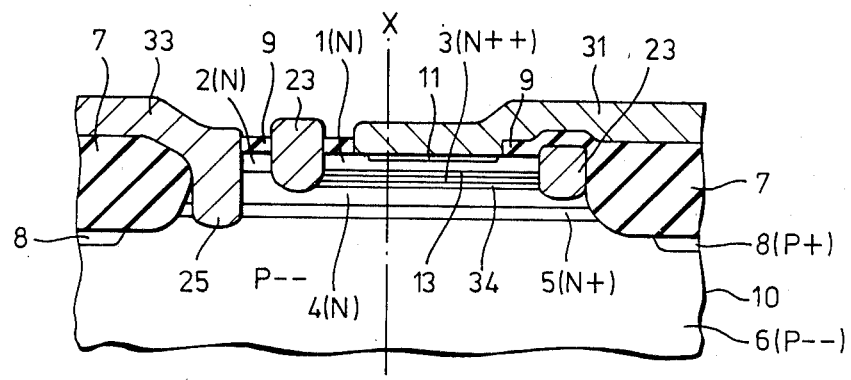
FIG. 2 is a cross-sectional view of the transistor of FIG. 1, taken on the line II—II of FIG. 1.

The hot-electron transistor illustrated in FIGS. 1 and 2 comprises a monocrystalline silicon semiconductor body 10 including a silicon surface region 1,2 which is adjacent the upper surface of the body 10, a silicon base region 3 which, at least partially underlies the surface region 1,2 and a silicon collector region 4,5 which at least partially underlies the base region 3. Barrier-forming means form an emitter-base barrier 13 between the base region and an emitter portion 1 of the surface region 1,2 and a base-collector barrier 34 between the base region 3 and the collection region 4,5. The current flow through the base region 3 from across the emitter-base barrier 13 is by hot-charge carriers of one conductivity type (electrons, with the conductivity types illustrated in FIG. 2).

The basic transistor structure of the FIG. 2 example comprising the silicon regions 1,3 and 4,5 with the intermediate emitter-base and base-collector barriers 13 and 34 is a monolithic device structure similar to that of hot-electron transistors described in GB-A 2056166, and especially FIG. 6 of GB-A 2056166. Thus, the base region 3 and collector region portion 5 are highly-doped semiconductor regions of one conductivity type, the surface region 1,2 and collector region portion 4 are low-doped semiconductor regions also of said one conductivity type, and the emitter-base and base-collector barriers 13 and 34 are formed by generally depleted semiconductor regions having a high doping concentration of the opposite conductivity type. The highly-doped collector region portion 5 is separated from the base-collector barrier region 34 by the low-doped collector region portion 4.

The base region 3 is a single very highly-doped n-type semiconductor region which may be, for example about 15 or 20 nm (nanometers) thick. The region 3 has a doping concentration of more than $10^{20}$ donor atoms/cm$^3$, and in a typical example may be formed by implanting a dose of $10^{14}$ to $10^{15}$ arsenic ions/cm$^2$. The base/collector barrier 34 is formed by a thin semiconductor region 34 which has a high acceptor doping concentration but which is substantially depleted of free charge carriers even at zero bias. The barrier region 34 is depleted by the merging together of the depletion layers formed at zero bias with the base region 3 and with the collector region portion 4. A typical thickness for the barrier region 34 is about 15 or 20 nm. The magnitude of the acceptor doping concentraion of the barrier region 34 determines the height of the potential barrier to the flow of electrons from the base region 3 to the collector region 4,5. In a typical example the base-collector barrier region 34 may be formed by implanting a dose of $1\times10^{13}$ to $1\times10^{14}$ boron or indium ions/cm$^2$.

The emitter-base barrier is formed by a thin semiconductor region 13 which has such a high acceptor doping concentration as to be undepleted at least over a part of its thickness by the depletion layers formed at zero bias with the base region 3 and emitter region portion 1. The application of a bias voltage between the base and emitter of the transistor is necessary to establish (for example by punch-through, avalanche or zener breakdown) a supply of hot electrons injected into the base region 3 at energies above the base-collector barrier. In this manner, as described in GB-A 2056166, the collection efficiency of the base-collector barrier is increased compared with a similar transistor having an emitter-base barrier region 13 already depleted at zero bias. In a typical example the emitter-base region may have a thickness of about 10 or 15 nm and may be formed by implanting a dose of at least $10^{14}$ boron or indium ions/cm$^2$.

In the particular example illustrated in FIGS. 1 and 2, the basic transistor structure 1, 3, 4, 5 with its barrier regions 13 and 34 is formed in an electrically-isolated island of the body 10 as part of an integrated circuit. Other circuit elements, for example similar transistors, are present in other islands of the body 10 at other areas of the upper surface. Thus, the body 10 comprises a high resistivity opposite conductivity type substrate 6 (p-type in FIG. 2) which forms an isolating p-n junction with the underside of the highly-doped n-type collector region portion 5 of each transistor island. The low-doped n-type regions 1,2 and 4 may be provided as high-resistivity layers of silicon grown on the substrate 6 in known manner, after locally doping the surface of the substrate 6 so as to provide the collector portion 5 as a buried region. These silicon layers 1, 2 and 4 may have a doping concentration of $10^{16}$ atoms/cm$^3$, wth the silicon layer 1,2 being for example 0.2 micrometers thick and the layer 4 being for example 0.25 micrometers thick.

In the form illustrated in FIGS. 1 and 2, the transistor island is isolated laterally by an apertured sunken dielectric layer 7 which may be of silicon dioxide formed in known manner by locally etching and oxidizing the high-resistivity silicon layers until the resulting oxide reaches into the substrate 6. The edge of the aperture of the sunken dielectric isolation layer 7 is indicated by a thick outline in FIG. 1. Also as illustrated in FIG. 2, a more highly-doped p-type annular region 8 is also present in the high resistivity substrate 6 to act as a channel-stopper below the sunken dielectric isolation layer 7. The conductivity-type determining doping concentrations of the substrate 6, the channel-stopper region 8, and the highly-doped buried region 5 may be, for example $5\times10^{14}$ cm$^{-3}$, $10^{19}$ cm$^{-3}$ and $5\times10^{20}$ cm$^{-3}$ respectively. Except at contact windows for emitter, base and collector electrodes, the upper surface of the transistor is passivated by an insulating layer 9, which may be for example of silicon dioxide 0.2 micrometers thick.

In accordance with the present invention, both the n-type base and collector regions 3 and 4,5 are extended to the upper surface of the transistor island by respective metal-silicide connection regions 23 and 25 which extends from said upper surface through the thickness of the surface region 1,2 and which forms an isolating Schottky barrier with an adjacent semiconductor portion as described hereinafter.

The base metal-silicide region 23 penetrates the emitter-base barrier region 13, penetrates and forms an electrical contact to the base region 3, and also penetrates the base-collector barrier region 34. This metal-silicide region 23 divides the surface region 1,2 into the separate emitter portion 1 having an emitter electrode connection 31 and the separate portion 2 adjacent the collector connection region 25. The metal-silicide region 23 form a Schottky barrier with both portions 1 and 2 of the low-doped n-type surface region 1,2

When during normal operation of the transistor the collector region 4,5 is biased positively with respect to the base region 3, the Schottky barrier which the region 23 forms with the portion 2 is reverse-biased and serves to isolate in accordance with the present invention this base metal-silicide region 23 from the n-type portion 2 which is effectively electrically part of the collector of the transistor. Furthermore, as illustrated in FIG. 1, the base-connection region 23 is of annular configuration and laterally surrounds wholly the layer structure formed by the emitter portion 1, the barrier region 13, the base region 3 and the barrier region 34; this results in both the emitter-base barrier region 13 and the base-collector barrier region 34 completely terminating at all sides in the metal-silicide region 23.

Since in the embodiment illustrated in FIG. 2 the metal-silicide region 23 extends through the entire thickness of the base region 3 and the base-collector barrier region 34, this region 23 also forms an isolating Schottky barrier with the underlying low-doped portion 4 of the collector region 5. The metal-silicode region 25 extends deeper in the body 10 than does the region 23, and penetrates to the highly-doped collector region portion 5 to form the collector connection of the transistor. In the transistor structure illustrated in FIG. 2 this silicide region 25 also penetrates through the collector region portion 5 to form an isolating Schottky barrier with the adjacent underlying portion of the p-type substrate 6.

The shallow base metal-silicode connection region 23 and the deeper collector metal-silicide connection region 25 may be of different metal silicide materials. Materials which may be used are, for example, platinum silicide, nickel silicide, and palladium silicide, all of which can be formed at low temperatures. However silicides formed at higher temperatures (for example tungsten silicide) can be used when localized transient heating techniques (such as pulsed electron or laser beam annealing) are employed to minimize dopant diffusion within the basic transistor doped layer structure 1, 13, 3, 34 and 4.

Base and collector electrode tracks 35 and 33 in the form of metal layers extend across the sunken dielectric layer 7 to the respectivemetal-silicide regions 23 and 25, by which these metal tracks 35 and 33 are connected to the base and collector regions 3 and 4,5 respectively. The tracks 35 and 33 may be of the same metal as is used to form the silicide regions 23 and 25 by reaction with the silicon of the body 10at the base and collector contact windows in the insulating layer pattern 7,9. However, if so desired the tracks 35 and 33 may be of a different subsequently-deposited metal.

An emitter electrode connection track 31 also extends over the insulating layer pattern 7,9 to contact the low-doped n-type portion 1 of the surface layer 1,2 at an emitter contact window. Since in the embodiment of FIGS. 1 and 2, the base metal-silicide connection region 23 completely laterally surrounds this portion 1, an intermediate insulating layer is provided at the cross-over area between the silicide region 23 and the emitter connection track 31. This intermediate insulating layer may be formed by depositing insulating material on the silicide region 23 in this area or for example by oxidizing the surface of the silicide region 23 in this area.

In order to isolate the emitter electrode 31 from the base silicide region 23 across the emitter portion 1, the emitter electrode layer 31 forms a Schottky barrier with this low-doped n-type portion 1 so that in operation the portion 1 is depleted of free charge carriers by the depletion layer formed at this reverse-biased emitter Schottky barrier spreading from the electrode layer 31 across the portion 1 to the emitter-base barrier region 13. Furthermore, in order to discourage electron flow to the surrounding silicide region 23 from the edge of the contact area of the emitter electrode 31, it is desirable for this emitter Schottky barrier to have an effective barrier height which is higher nearer the silicide region 23 than it is remote from the silicide region 23. This can be achieved by having as illustrated in FIGS. 1 and 2 a very shallow surface layer 11 with a high donor doping at the contact area between the electrode 31 and low-doped n-type region portion 1 but spaced from the edge of said contact area in order to reduce locally the Schottky barrier height in the manner described in U.K. patent (GB-A) 1459231. In a typical example of the FIGS. 1 and 2 embodiment the emitter electrode layer 31 may be of nickel and the layer 11 may be formed by implanting 5 keV arsenic ions in a dose of $10^{13}$ cm$^{-2}$.

Figure 3:
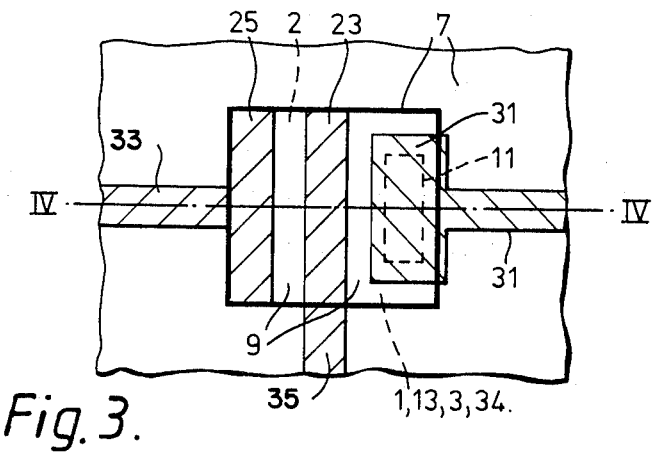
FIG. 3 is a plan view of another hot-electron transistor in accordance with the invention.
Figure 4:
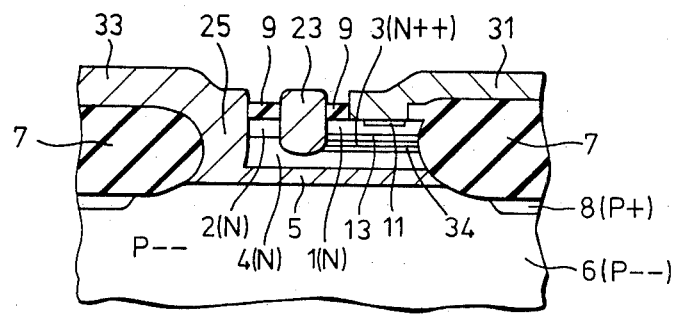
FIG. 4 is a cross-sectional view of the transistor of FIG. 3, taken on the line IV—IV of FIG. 3.

FIGS. 3 and 4 relate to another hot-electron transistor in accordance with the invention which illustrates several modifications of the transistor structure of FIGS. 1 and 2. In the transistor of FIGS. 3 and 4, the low-doped n-type surface region 1,2 is still divided into separate portions 1 and 2 by the dividing metal silicide region 23 which extends the base region 3, but in this case the region 23 is in the form of a stripe which laterally bounds the region structure 1, 13, 3 and 34 at only one side. The region structure 1, 13, 3 and 34 is bounded at its other sides by the sunken dielectric layer 7 thus obtaining a very compact geometry. Similarly, instead of extending on three sides of the collector region portions 4, 5, 2 as in FIGS. 1 and 2, the collector silicide connection region 25 also only contacts these regions 4,5 and 2 at one side. As illustrated in FIG. 3, the emitter electrode track 31 does not need to cross-over the metal-silicide region 23 which also simplifies manufacture.

A further modification illustrated in FIG. 4 is that, instead of a semiconductor region, the highly-conductive portion 5 of the collector region 4,5 is a metal-silicide layer on which the low-doped silicon layers providing the semiconductor region portions 4, 1 and 2 are subsequently deposited. This metal-silicide buried collector layer 5 forms an isolating Schottky junction with the substrate 6. Such a silicide buried collector layer 5 may be used in the FIGS. 1 and 2 transistor and can have a significantly lower resistance than a doped semiconductor portion 5; the replacement of the substrate isolating p-n junction by the Schottky barrier also eliminates from the structure another possible source of minority carriers. However, instead of using a Schottky junction to provide the substrate isolation, the substrate 1 may be of electrically insulating material (for example silicon dioxide), at least at its upper surface adjacent the metal-silicide collector region portion 5 and the sunken dielectric layer 7.

Many other modifications are possible within the scope of the present invention. Thus, by choosing for regions 23 and 25 metal-silicides which form a Schottky barrier of high barrier height to p-type silicon, the divided surface region 1,2 in the embodiments of FIGS. 1 and 2 and FIGS. 3 and 4 may be of low-doped p-type silicon so that in operation the p-type region 1 forms a fully-depleted portion of the emitter-base barrier which still also includes the region 13 having a high acceptor doping. In this case, the emitter electrode 31 may form either an ohmic contact or a Schottky barrier with the low-doped p-type region 1. Also in this case the dividing metal-silicide base connection region 23 should terminate in the highly-doped n-type base region 3 so that it does not contact the low-doped n-type collector region portion 4 by penetrating the base-collector barrier region 34.

Figure 5:
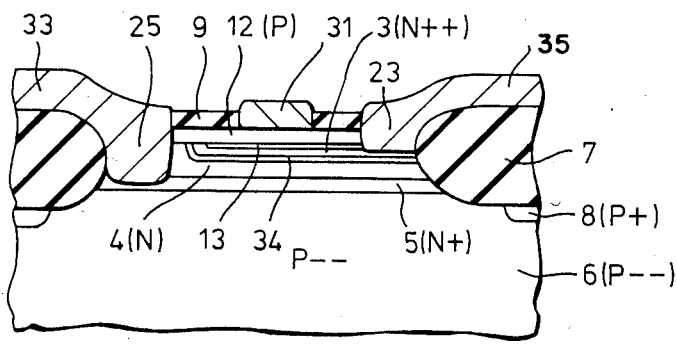
FIG. 5 is a cross-sectional view of a further hot-electron transistor in accordance with the invention.

FIG. 5 illustrates a further modification of a similar hot-electron transistor having a p-type surface region 12 which (unlike the surface region 1,2 of the embodiments of FIGS. 1 and 2 and FIGS. 3 and 4) is not divided into two separate portions 1 and 2 by the metal-silicide base connection region 23. In the transistor of FIG. 5, the metal-silicide base connection region 23 contacts the highly-doped n-type base region 3 at least at one side of the transistor island, and the metal-silicide collector connection region 25 contacts the highly-doped n-type collector region portion 5 at least at the opposite side of the transistor island. At the side of the base region 3 which faces the collector connection region 25, the n-type base region 3 is separated laterally from the low-doped n-type collector region portion 4 by part of the base-collector barrier region 34, and the emitter-base barrier region 13 is separated laterally from this part of the base-collector barrier region 34 by part of the base region 3. The low-doped collector region portion 4 forms a p-n junction with the p-type surface region 12 at this area between the base region 3 and the metal-silicide collector connection region 25, and the metal-silicide region 25 forms a Schottky barrier with the p-type surface region 12 so that the emitter 31 of the transistor is isolated from the collector region 4,5 and its connection 25,33.

In the embodiments of FIGS. 1 and 2 and FIGS. 3 and 4 and FIG. 5 a base electrode layer 35 is present in the transistor so that the metal-silicide region 23 serves a connection function as well as an isolation function. Such transistors may be optimized for high frequency amplification or fast-switching applications. However, such a metal-silicide region 23 may be incorporated in a photo-transistor in accordance with the invention; in the case of a photo-transistor there is generally no base electrode layer 35 so that the region 23 merely serves an isolation function in extending the base region 3 to the upper surface of the body 10. Furthermore although in the embodiments shown, the transistor is one circuit element of an integrated circuit, transistors in accordance with the invention may instead by discrete devices. In the case of a discrete hot-electron transistor, the whole substrate 6 may be of n-type conductivity and form the highly-doped collector region portion (5 of earlier embodiments) on which the n-type silicon layer forming the low-doped region portion 4 is deposited, and the collector electrode may be present over the whole back surface of this collector substrate (instead of at the upper surface of the body 10).

In the case of an integrated circuit the lateral isolation between separate transistor islands may be provided by the collector metal-silicide region 25 instead of by a sunken dielectric layer 7. In this case, the separate islands each have a separate annular metal-silicide region 25 which laterally bounds all sides of that island and which is spaced by an intermediate silicon region from the metal-silicide region 25 of adjacent islands. This annular metal silicide region 25 of each island must also be spaced from the base region 3 and associated silicide region 23 of that island.

The transistors as shown in the drawings have a single emitter and one emitter-base barrier. However, transistors in accordance with the invention may have a plurality of emitters located side-by-side each having an individual emitter-base barrier with the base region 3. The metal-silicide region 23 which contacts the base region 3 may extend in-between these side-by-side emitters. Such multi-emitter transistors may, for example, be designed for higher power operation or as fast switching transistors in a logic circuit. Transistor structures in accordance with the invention may be integrated with other semiconductor regions and provided with appropriate electrode connections to form more complex devices.

The transistors so far described have been hot-electron transistors. However hot-hole transistors are also possible in accordance with the invention, in which case the base and collector regions 3, 4, 5 would be p-type and the barrier regions 13 and 34 would be doped with donor impurity. Furthermore it is not necessary for hot-electron and hot-hole transistors in accordance with the invention to have barrier regions of the type described in GB-A 2056166.

Thus, the emitter-base and/or base-collector barriers may be of a multi-layer type as described in, for example, the article by R. J. Malik et al., entitled "Planar-Doped Barriers in GaAs by Molecular Beam Epitaxy" published in Electronic Letters, Vol, 16, page 837 ff. (1980). Each such multi-layer barrier comprises a fully-depleted, thin highly-doped region sandwiched between two intrinsic semiconductor regions which also form part of the barrier. When fabricated in a silicon transistor structure in accordance with the invention, the region portion 4 may form the intrinsic region at the collector side of the base-collector barrier, and the region portion 1 may form the intrinsic region at the emitter side of the emitter-base barrier. In this case a higher doped emitter region is provided in the intrinsic region portion 1 and is contacted by the emitter electrode connection. The highly-doped barrier region is p-type in the case of a hot-electron device and can be compared with the highly-doped region 13,34. However additional intrinsic regions will be present between the base region 3 and these highly-doped regions of the emitter-base and base-collector barriers.

FIG. 4 illustrates a transistor in accordance with the invention having a metal-silicide collector region portion 5. Transistors in accordance with the invention are also possible in which the base region 3 is a metal-silicide region; in this case, the emitter-base and collector-base barriers may be Schottky barriers which the metal-silicide base region 3 forms directly with the n-type emitter and collector silicon region portions 1 and 4. The metal-silicide base region 3 may then be extended to the upper surface in accordance with the invention by a metal-silicide region 23 in a manner similar to that described hereinbefore. Although such a transistor has a particularly simple structure, the hot electrons injected into the base region 3 and flowing to the collector region 4,5 must traverse interfaces between different materials at the emitter-base and base-collector barriers. This can result in quantum-mechanical reflection of the hot-electrons with poor emitter and collector efficiency and poor carrier transport, and so this structure is generally less desirable than the completely monolithic silicon emitter-base-collector structure illustrated in FIGS. 1 and 2 and FIGS. 3 and 4 and FIG. 5.

What I claim is:

1. A transistor comprising a semiconductor body including a silicon surface region adjacent a surface of the body, a base region which at least partially underlies the surface region, a collector region which at least partially underlies the base region, a barrier-forming means which form an emitter-base barrier between the base region and at least a portion of the surface region and a base-collector barrier between the base region and the collector region, the current flow through the base region from across the emitter-base barrier being by hot charge carriers characteristic of one conductivity type, characterized in that at least one of the base and collector regions is extended to said surface of the body by a metal-silicide region which extends from said surface at least through the thickness of the surface region to contact electrically said one of the base and collector regions, said metal-silicide region forming an isolating Schottky barrier with an adjacent semiconductor portion of the body to isolate electrically said one of the base and collector regions from said adjacent semiconductor portion.

2. A transistor as claimed in claim 1, further characterized in that said adjacent semiconductor portion with which one said metal-silicide region forms an isolating Schottky barrier is a portion of the surface region.

3. A transistor as claimed in claim 2, further characterized in that said one metal-silicide region extends the base region to said surface and divides the surface region into separate first and second portions, the first portion is present between the base region and an emitter connection, the second portion is located adjacent a collector connection, and the isolating Schottky junction isolates this dividing metal-silicide region from one of the first and second portions of the surface region during operation of the transistor.

4. A transistor as claimed in claim 3, further characterized in that the emitter-base barrier is present between the base region and the first portion of the surface region and terminates at least at one side in said dividing metal-silicide region.

5. A transistor as claimed in claim 3 or claim 4, further characterized in that the dividing metal-silicide region laterally surrounds the whole of said first portion of the surface region.

6. A transistor as claimed in claim 3 or claim 4, further characterized in that the surface region is of the one conductivity type, and the emitter connection comprises an emitter electrode layer forming a Schottky barrier with the first portion of the surface region.

7. A transistor as claimed in claim 6, further characterized in that the Schottky barrier formed between the emitter electrode layer and the first portion of the surface region has an effective barrier height which is higher nearer the dividing metal-silicide region than it is remote from the dividing metal-silicide region.

8. A transistor as claimed in claim 1, 2, 3 or 4 further characterized in that a base electrode layer is present at the surface of the body and is connected to the base region by one said metal-silicide region.

9. A transistor as claimed in claim 1, 2, 3 or 4, further characterized in that the base region is extended to said surface by one said metal-silicide region which extends through the thickness of the base region to form an isolating Schottky barrier with an underlying low-doped semiconductor portion without extending as far as a more highly-conductive portion of the collector region.

10. A transistor as claimed in claim 9, further characterized in that the base-collector barrier terminates at least at one side in said one metal-silicide region which forms the isolating Schottky barrier with said underlying low-doped semiconductor portion.

11. A transistor as claimed in claim 1, 2, 3 or 4, further characterized in that the base region comprises at least a highly-doped semiconductor portion which is of the one conductivity type and which is at least $10^3$ times more highly doped than a portion of the surface region with which the metal-silicide region forms the isolating Schottky barrier.

12. A transistor as claimed in claim 11, further characterized in that said base region is formed by a single highly-doped semiconductor region having a conductivity-type-determining doping concentration of at least $10^{20}$ dopant atoms/cm$^3$.

13. A transistor as claimed in claim 1, 2, 3 or 4, further characterized in that the collector region comprises a highly-conductive portion which is separated from the base-collector barrier by a lower-conductive low-doped semiconductor portion of the collector region, and a collector electrode layer present at the surface of the body is connected to the collector region by one said metal-silicide region which contacts said highly-conductive portion of the collector region.

14. A transistor as claimed in claim 9, further characterized in that the highly-conductive portion of the collector region is a metal-silicide layer.

15. A transistor as claimed in claim 9, further characterized in that the highly-conductive portion of the collector region is a highly-doped semiconductor portion of the one conductivity type.

16. A transistor as claimed in claim 1, 2, 3 or 4, further characterized in that at least one of the emitter-base and base-collector barriers comprises a semiconductor barrier region which has a doping concentration of the opposite conductivity type to said one conductivity type and which terminates laterally in one said metal-silicide region, said barrier region being depleted of charge-carriers of said opposite conductivity type at least during operation of the transistor.

17. A transistor as claimed in claim 16, further characterized in that the emitter-base barrier-forming means comprises one said barrier region which is located between the surface region and the base region and which is undepleted at least over a part of its thickness by the depletion layers present at the emitter-base barrier at zero bias, the application of a bias voltage between the base and emitter of the transistor being necessary to establish a supply of hot carriers characteristic of the one conductivity type injected into the base region at energies above the base-collector barrier.

18. A transistor as claimed in claim 16, further characterized in that the base-collector barrier-forming means comprises one said barrier region which is located between the base region and the collector region and which is substantially depleted of free charge carriers by the depletion layers formed at zero bias with the base and collector regions.

* * * * *